United States Patent [19]

Lux et al.

[11] 4,057,097

[45] Nov. 8, 1977

[54] CASTING PROCESS WITH INSTANTANEOUS UNIDIRECTIONAL SOLIDIFICATION

[75] Inventors: Benno Lux, Veyrier; Wilfried Kurz, Lausanne, both of Switzerland; Jean-Claude Hubert, Saint-Maur; François Mollard, Gaillard, both of France; Guido Walt, Geneva, Switzerland

[73] Assignee: Battelle Memorial Institute, Geneva, Switzerland

[21] Appl. No.: 664,093

[22] Filed: Mar. 5, 1976

[30] Foreign Application Priority Data

Mar. 7, 1975 Switzerland ............................ 2895/75

[51] Int. Cl.$^2$ ............................................. B22D 27/20
[52] U.S. Cl. ...................................... 164/60; 164/122
[58] Field of Search .................. 164/60, 122, 348, 361

[56] References Cited

U.S. PATENT DOCUMENTS 3,620,289  11/1971  Phipps ..................................... 164/60
3,857,436  12/1974  Petrov et al. ........................... 164/60

OTHER PUBLICATIONS

Reed-Hill, "Physical Metallurgy Principles", pp. 367–391, 1964.
Davies, "Solidification and Casting", pp. 15–21, 1973.

*Primary Examiner*—Robert D. Baldwin
*Attorney, Agent, or Firm*—Karl F. Ross

[57] ABSTRACT

A metallic alloy is cast in a mold to produce a solid body by unidirectional solidification. The alloy, initially in a molten state, is cast into a mold and is completely and progressively cooled in the mold while a unidirectional thermal gradient superimposed thereon parallel to a direction determined by the configuration of the mold (predetermined direction) until a metastable equilibrium is reached in which the entire body of the melt is in a super-cooled state as a homogeneous liquid. The equilibrium is then broken to cause solidification of the alloy and the formation of dendritic crystals with their principal axes parallel to the thermal gradient substantially instantly and without noticeable advance of a solidification front across the melt.

6 Claims, 1 Drawing Figure

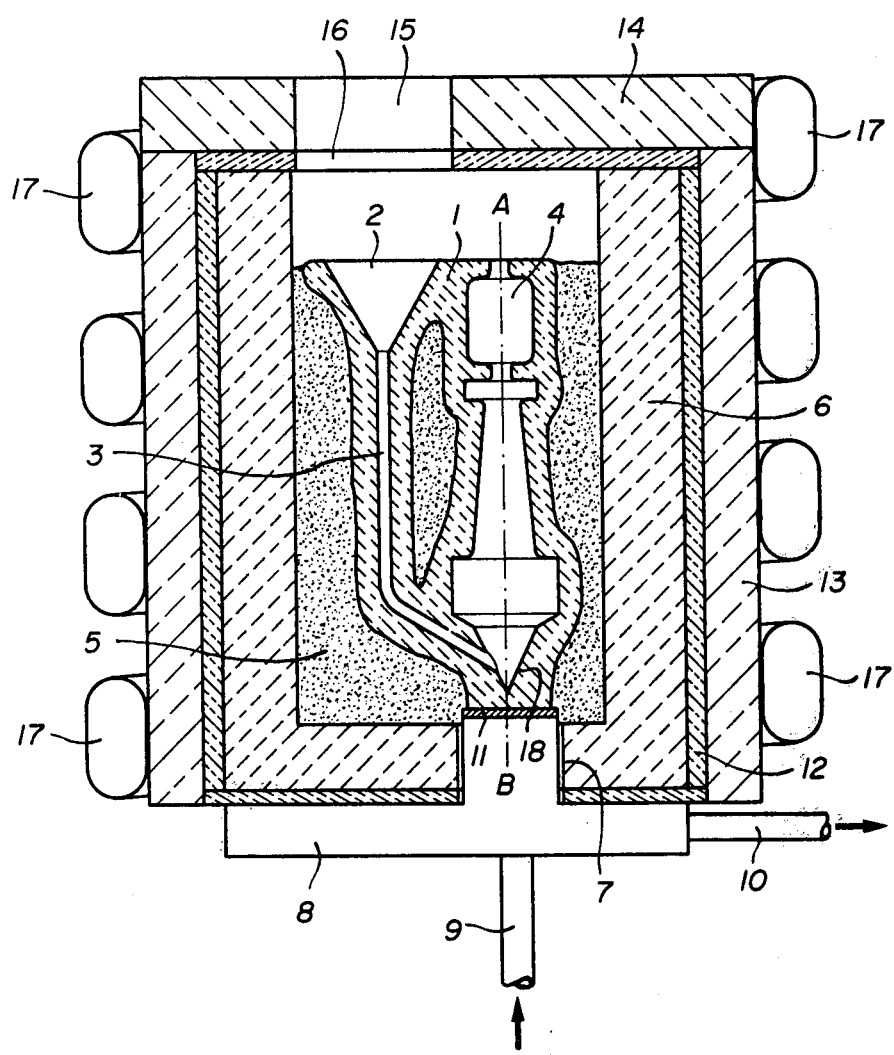

CASTING PROCESS WITH INSTANTANEOUS UNIDIRECTIONAL SOLIDIFICATION

FIELD OF THE INVENTION

The present invention relates to a method of casting of metal alloys to produce unidirectionally solidified objects therefrom.

BACKGROUND OF THE INVENTION

Unidirectional solidification is known in the production of bodies from superalloys, for example gas-turbine vanes, such that fibers, filaments or elongated crystal structures are formed in a matrix of the body by the unidirectional solidification.

The unidirectional solidification process which produces the reinforcing phase within the matrix phase sharply increases significant mechanical properties of the bodies, especially high-temperature strength and tensile strength. Improvements in other physical properties have likewise been recognized.

In general unidirectional solidification of cast alloys has been achieved heretofore by the progressive advance of a solidification front between the solidified melt and the liquid phase at a rate which permits the growth of the reinforcement phase in the form of dendrites whose principal axis extends in the direction of solidification. The rate at which the front advances is, of course, limited by the rate of solidification of the alloy and depends, in turn, upon the rate of cooling of the body of the alloy.

In prior-art processes the unidirectional solidification is generally carried out with displacement of the solidification front at a rate of about 10 – 30 cm/hr.

Because this rate is relatively low, the production of superalloy bodies by unidirectional solidification has been a relatively slow process. Various techniques have been proposed in order to modify the apparatus for unidirectional solidification so as to improve the cooling efficiency and hence increase the rate of displacement of the solidification front.

In French Pat. No. 2,184,610, for example, there is described an apparatus which permits the rate of displacement of the solidification front to reach a value of 455 cm/hr.

The increase in the rate of displacement of the solidification front has the advantage on the one hand that it reduces the time required for fabrication of a body and, on the other hand, that it permits the production of a very fine dendritic structure which has been found to be desirable for the high-temperature properties of the body.

OBJECT OF THE INVENTION

It is the principal object of the present invention to provide a method of producing a unidirectionally solidified metal alloy body with an extremely high rate of solidification to obtain a very fine dendritic crystal structure over a very short period of time, thereby also increasing the rate at which such bodies can be produced in a mold.

SUMMARY OF THE INVENTION

This object and others which will become apparent hereinafter are attained, in accordance with the present invention, in a process in which one cools, progressively and totally, the molten alloy within a mold while maintaining a unidirectional thermal gradient parallel to a predetermined direction. This direction is in the direction of the major orientation of the mass of the alloy and, of course, depends upon the shape of the mold, i.e. will generally extend in the major dimension of the body to be produced. The cooling is carried out so as to bring the entire mass of the alloy to a metastable supercooled equilibrium in the form of a homogeneous liquid phase.

When the entire mass of the molten alloy is in the supercooled metastable equilibrium and in homogeneous liquid phase, the supercooling equilibrium is broken to effect a substantially total solidification of the alloy to produce a solid body having a dendritic crystal structure comprised of fine dendrites having their principal axes parallel to the direction of the applied thermal gradient.

Preferably, the alloy is introduced in a liquid state into the mold after having been brought to a temperature above the melting point of the alloy to avoid solidification of the latter upon its introduction into the mold.

It is within the purview of this invention, however, to introduce the alloy in a solid state into the mold, for example in the form of a powder, granules, chips or the like and to melt the solid alloy within the mold, i.e. to form the liquid in situ.

In order to prevent possible oxidation of the alloy in the mold at an elevated temperature, we have found it to be advantageous to carry out the melting and the solidification within the mold under an inert atmosphere or under vacuum. The preferred inert atmosphere is an atmosphere of nitrogen.

According to the process of the invention, the unidirectional solidification of the alloy is carried out by simple cooling of the liquid alloy from a temperature above that of its liquidus to a temperature below that of a liquidus by a value $\Delta T_{max}$ which corresponds to the maximum practical value of the degree of supercooling $\Delta T$ which one can achieve under the operating conditions adopted. The solidification which is then produced, in a practically instantaneous manner throughout the mass of the alloy, does not appear to have any soidification front which advances through the mass of the alloy, and is effected once the latter temperature is attained.

In order to trigger the solidification before the value of $\Delta T_{max}$ of the degree of cooling $\Delta T$ is attained, thereby destroying the supercooling equilibrium, a conventional technique may be used, for example, the introduction of a small crystal of the alloy into the liquid alloy mass, or the immersion of a metallic filament, for example a nickel filament, into the alloy, or the application of thermal shock, e.g. rapid cooling, or a mechanical disturbance of the supercooled alloy when the latter has been brought to its lowest possible supercooled temperature.

Thus the solidification takes place substantially instantaneously and the rate of formation or growth of the dendrites does not depend upon the rate of displacement of a cooling front, by contrast with the unidirectional solidification processes known.

The maximum value of the degree of supercooling $\Delta T$ depends on several parameters of which the principal are the nature of the alloy (composition), the rate of cooling of the alloy in the liquid stage, and the nature and condition of the surfaces of the internal walls of the mold.

As a first approximation and most generally it may be said that the greater the rate of cooling of the alloy in the liquid state, the greater is the value of $\Delta T_{max}$.

We have found that it is possible to increase the maximum practical value of the rate of cooling $\Delta T_{max}$ by a pretreatment of the alloy before it is introduced into the mold. This pretreatment consists of a series of cycles of supercooling and partial solidification of the supercooled liquid, followed by reheating and remelting of the solidified portion. Such cycles have been found to increase significantly the maximum value of $\Delta T$ which can be possibly obtained in a subsequent cycle, e.g. the actual unidirectional solidification stage.

We have found further that the dendritic structure is finer as the rate of supercooling, to the instant of interruption or disturbance of the supercooled equilibrium, is greater. This appears to demonstrate that the rate of solidification of the alloy is a direct function of $\Delta T$.

It should be noted, in this connection, that the solidification of the alloy occurs practically instantaneously. It has been impossible to measure the rate of solidification and, a fortiori, to study the possible variation of this rate as a function of the rate of supercooling at the instant of disturbance of the supercooled equilibrium.

It should be noted also that the rate of solidification of the alloy is not to any significant extent a function of the rate of cooling of the liquid mass, this being a complete break from the conventional processes for unidirectional solidification.

The invention also relates to an apparatus for carrying out the process of the present invention. This apparatus comprises a mole (at least one) disposed in the interior of a chamber provided with controllable heating means and means for establishing in the interior of the mold a thermal gradient from one part of the latter to a wall of the mold in contact with the melt.

Advantageously, the foot of the mold is closed by a wall of the mold which is provided with cooling means, or is in contact with the cooling means, for the cooling of this part of the mold wall without direct contact between the interior of the mold and the cooling means. The cooling means should be controllable to vary the rate of cooling.

The cooling means permits establishing within the interior of the mold, while the latter is filled with a mass of liquid metal in a metastable equilibrium of supercooling, a thermal gradient running from the interior of the mold to the foot of the latter.

The fact that the cooling means is not in direct contact with and does not act directly upon the interior of the mold avoids possible preliminary crystallization of the alloy before the rate of supercooling $\Delta T$ suffices to permit a total cooling and solidification of the melt by disturbance of the metastable equilibrium.

It has been found to be advantageous, in this regard, to provide the mold with auxiliary walls of a material having a high thermal insulation coefficient and interposed between the cooling means and the remaining walls of the mold. It has been found to be advantageous, moreover, to provide the foot of the mold with a projection which serves to facilitate orientation of dendritic growth within the alloy.

The heating means may be any conventional heating arrangement, for example, an electric resistance furnace, an arc furnace, a flame furnace or an induction furnace. It has, however, been found to be particularly advantageous to employ an induction furnace having an introduction-susceptible body delimiting a heating chamber and at least one solenoid-type inductor surrounding the susceptible body and supplied by a high-frequency alternating-current source.

In order to permit solidification and cooling of the alloy under an inert atmosphere or under vacuo, it has been found to be advantageous to provide this chamber within a housing which may be connected by duct means with a source of the inert atmosphere (e.g. nitrogen), or a suction source.

BRIEF DESCRIPTION OF THE DRAWING

The sole FIGURE of the drawing shows an axial cross-sectional view through a schematically represented apparatus for carrying out the process of the present invention.

SPECIFIC DESCRIPTION

In the drawing we show a device which comprises a mold 1 of the carapace type fed by a casting funnel 2 and provided with a sprue channel 3 opening into the bottom of the mold cavity. The top of the mold cavity is provided with a riser 4 open to the space above the mold.

The mold is surrounded by a pulverulent mass 5 formed of alumina granules, which, in turn, are surrounded by a magnetically susceptible body or susceptor 6 having the configuration of a cylindrical receptacle. The bottom of the susceptor 6 is formed with a circular opening 7 into which projects a cooler 8 constituted by a metal receptacle, the metal of which is a good conductor for heat, for example copper. In the cooler a cooling liquid such as water is circulated. The cooler 8 is fed by a conduit 9 with the cooling liquid and discharges the cooling liquid via a conduit 10. The mold 1 rests upon a cushion 11 of small thickness (for example several millimeters) of a material having a good insulation coefficient (i.e. a good thermal insulator) such as quartz wool, the cushion being supported by a portion of the cooler 8 projecting through the opening 7.

The susceptor 6 is entirely surrounded by a sheath 12 of a material having a good coefficient of thermal insulation, for example a carbon felt.

The sheath 12 is, in turn, surrounded by a wall of thermal insulation 13 of a material having a good coefficient of thermal insulation, for example quartz wool. A cover 14, also of a material having a good coefficient of thermal insulation such as quartz wool, covers the upper part of the sheath 12 and the wall 13. A circular orifice in this cover is provided with a removable plug 15 of the same material as the cover 14, with a bottom 16 of the same material as the sheath 12. This opening is provided above the mouth of the funnel 2.

The apparatus is surrounded by a number of turns of a tubular electrical conductor cooled by the circulation of an appropriate liquid such as water and constituting a solenoid-type inductor for a high-frequency furnace, the inductor serving to heat the susceptor 6. The high-frequency source for the conductor 17 has not been illustrated.

The shape of the mold shown in the drawing corresponds to that of a turbine blade or vane with an orientation appendage 18 disposed at the lower portion of the mold cavity. Unidirectional solidification is to take place such that the dendritic structure of the alloy has its principal axes parallel to the longitudinal axis A – B of the mold and, consequently, of the finished piece.

Of course the device may be used for the formation of pieces of different shapes with different orientations of the unidirectional solidification axis. The nature of the mold or at least that of its interior walls is generally so chosen with respect to the composition of the alloy to be employed, that it permits the highest possible degree of supercooling to be obtained.

For example when the alloy to be used is a nickel-base superalloy such as MAR-M200, it has been found to be advantageous to use a mold in which parts of the interior walls are formed of zirconium silicate ($ZrSiO_4$-zircon) or a mixture of zirconium silicate and alumina, e.g. a mixture comprising 70% by weight aluminum and 30% by weight zircon.

For instance the mold can have walls which are constituted by particles of zirconium silicate powder or particles of a mixture of alumina powder and zirconium silicate powder bonded into a solid body by a suitable amount of sodium silicate (water glass) in a manner known per se.

Where the alloy is a superalloy of a cobalt base such as MAR-M-509, it has been found to be advantageous to employ a mold whose internal faces are formed at least in part of a fused-silica material.

The susceptor 6 is also a material suitable for achieving the desired degree of supercooling and is preferably graphite.

The apparatus is operated as follows:

After having preheated the mold 1 to bring the funnel 2 and the sprue channel 3 to a temperature above that of the liquidus of the alloy, the molten alloy is introduced into the mold and flows in a liquid state through the funnel 2 and the sprue channel 3 to fill the mold while the entire assembly 1, the funnel 2 and channel 3 are maintained at a temperature above that of the liquidus to avoid any premature crystallization of the alloy.

To this end, a high-frequency electric current is applied to the turns 17 of the induction heating coil with an intensity sufficient to bring the susceptor 6 to a temperature above that of the alloy and sufficient to maintain the alloy at a temperature above its liquidus during the filling of the mold.

Once the mold is filled with the alloy, the elevated temperature is maintained to permit the development of a temperature gradient (unidirectional) which increases from the bottom to the top. This gradient is produced by abstraction of heat at the bottom part of the mold by means of a cooler 8. During this time, of course, one controls the input of thermal energy from the solenoid 17 and the susceptor 6 and the abstraction of heat by the cooler 8 so that the temperature of the top of the alloy mass remains above its liquidus temperature.

Thereafter, the heating energy is progressively reduced and the cooling liquid is controlled to lower the temperature throughout the liquid alloy to its supercooling domaine at a convenient rate, for example, 20° C/min., without disturbance of the metastable supercooling equilibrium.

Thereafter, the metastable equilibrium is broken spontaneously, e.g. by the application of thermal shock, by a rapid abstraction of heat by the cooler 8 as the rate of supercooling approaches its maximum $\Delta T_{max}$.

It should be noted, at this point, that the system differs from that described in French Pat. No. 2,184,610 according to which solidification of the alloy is induced by cooling of a lower portion of the alloy below its crystallization temperature in order to bring about such crystallization. In this system the remainder of the alloy is maintained in a liquid state at a temperature above the crystallization temperature, i.e. the entire mass of alloy is not cooled below its crystallization temperature, i.e. to a supercooling state. In the present invention, the entire mass of alloy is initially in a liquid state, fully homogeneous, at a temperature well below its solidification or crystallization temperature. Thus the entire mass of alloy is at a metastable supercooled equilibrium in the form of a homogeneous liquid before the beginning of solidification.

Since the lower part of the mold is not open, as is the case with the device described in French Pat. No. 2,184,610 (see especially FIGS. 1, 2 and 5 of this patent), but is closed, the alloy never comes into contact with a zone maintained at a temperature below its melting point during the cooling of the alloy in the mold. Thus formation of a crystallization seed prematurely is avoided and it is possible to bring the entire liquid alloy mass to a high degree of supercooling $\Delta T$ before triggering the solidification.

SPECIFIC EXAMPLES
EXAMPLE 1

Using the device illustrated in the drawing, gas turbine blades are produced from a nickel-base superalloy known under the designation MAR-M 200 and having the following nominal composition (in percent by weight):

| | | | |
|---|---|---|---|
| C = | 0.13 | Mn = | 0.05 |
| Cr = | 6.93 | W = | 12.8 |
| Al = | 5.13 | B = | 0.014 |
| Cu = | 0.10 | N = | 12 ppm |
| Si = | 0.1 | Co = | 10.09 |
| Fe = | 0.05 | Ti = | 2.11 |
| Nb = | 0.88 | S = | 0.002 |
| Zr = | 0.04 | Ni = | Balance. |

The operating conditions are as follows:

Nature of the internal walls of the mold; zircon (zirconium silicate:$ZrSiO_4$):
Initial temperature of the liquid alloy mass: 1475° C.
Rate of cooling: 20° C/minute.
Degree of supercooling at the instant of interruption of the supercooling equilibrium 30° C.
Mode of interruption of the supercooling equilibrium: spontaneous.

The turbine blade thus obtained has a hyperfine dendritic structure oriented unidirectionally in a direction parallel to the longitudinal axis of the body (i.e. the direction of the major dimension of the body and the greatest stress in use of the turbine blade).

The tensile tests, carried out with a sample cut from the central part of such a vane, with a deformation rate of 0.145% per second, give the following results:

| | at 20° C | at 1000° C |
|---|---|---|
| Breaking strain - tensile strength | 114 hbar | 71.5 hbar |
| Elongation to break (A) | 14.5% | 5.4% |
| Elastic limit at 0.2% ($R_{E_{0.2}}$) | 82 hbar | 64 hbar |

For comparison purposes, a sample of this superalloy having a unidirectionally oriented dendritic structure but obtained by conventional unidirectional solidification with advance of the solidification front has a tensile strength of 100 hbar at 20° C and of 50 hbar at 1000° C measured under traction conditions.

EXAMPLE 2

The device illustrated in the drawing was used to produce a gas turbine vane with a cobalt base superalloy under the designation MAR - M 509 and have the following nominal composition (in weight percent):

| Cr = | 22.5 | Ti = | 0.2 |
|------|------|------|------|
| Ni = | 10 | B = | 0.01 |
| W = | 7 | Zr = | 0.5 |
| Ta = | 3.5 | Co = | Balance. |
| C = | 0.6 | | |

The process was carried out under the following conditions:

Nature of the internal walls of the mold: fused silica
Initial temperature of liquid alloy mass: 1475° C
Rate of Cooling: 20° C/min.
Degree of supercooling at the instant of interruption of supercooling equilibrium: 60° C
Mode of interruption of supercooling equilibrium: spontaneous The result is a turbine blade having a hyperfine dendritic structure oriented unidirectionally in a direction parallel to the longitudinal axis of the body.

We claim:

1. A process for producing a solid body of a metallic alloy with a unidirectionally oriented fine dendritic structure obtained by solidification of an alloy melt within a cavity of a mold associated with controllable heating and cooling means capable of producing a unidirectional temperature gradient in said melt, said process comprising the steps of:
  a. progressively precooling the entire body of the alloy melt within the mold cavity down to a supercooled liquid state in metastable equilibrium so as to thereby form a homageneous supercooled melt of said alloy throughout the mold cavity while simultaneously maintaining a unidirectional temperature gradient along said supercooled melt; and
  b. provoking complete solidification of the entire supercooled alloy melt practically instantaneously throughout the mold cavity by disturbing the said state of metastable equilibrium in said supercooled alloy melt, so as to thereby solidify said body with growth of a fine dendritic crystal structure oriented parallel to the direction of said temperature gradient.

2. The process defined in claim 1, further comprising the step of subjecting the body of the alloy melt within the mold cavity, prior to said precooling step (a), to a series of cycles of supercooling, solidification and remelting to thereby increase the maximum degree of supercooling to which the body of the alloy melt can be subjected in said step (a).

3. The process defined in claim 1 wherein said state of metastable equilibrium is disturbed by bringing the lowest temperature of said supercooled alloy melt down to a value corresponding to the maximum degree of supercooling to which said alloy can be subjected.

4. The process in claim 1 wherein said state of metastable equilibrium is disturbed by suddenly increasing the cooling at the zone of lowest temperature in said supercooled alloy melt to thereby apply a thermal shock for provoking complete solidification of the supercooled alloy within the mold cavity.

5. The process defined in claim 1 wherein said state of metastable equilibrium is disturbed by applying a mechanical shock to the body of the supercooled alloy melt, at the zone of lowest temperature in the supercooled melt.

6. A process for producing a solid body of a metallic alloy solidified unidirectionally, comprising the steps of:
  forming a melt of said alloy within a mold cavity;
  cooling said melt within said mold cavity to bring the entire body of the melt into a metastable equilibrium of supercooling in the form of a homogeneous liquid;
  applying a unidirectional thermal gradient across the supercooled melt;
  disturbing this equilibrium to induce solidification of said alloy practically instantaneously in the form of a body having a dendritic crystal structure comprising dentrites having their principal axes parallel to the direction of said thermal gradient; and
  treating said alloy, prior to the aforementioned cooling thereof, to a series of cycles of supercooling, solidification and remelting to increase the maximum value of the degree of supercooling to which said body can be subjected.

* * * * *

Dedication 4,057,097.—*Benno Lux,* Veyrier; *Wilfried Kurz,* Lausanne, both of Switzerland; *Jean-Claude Hubert,* Saint-Maur; *Francois Mollard,* Gaillard, both of France and *Guido Walt,* Geneva, Switzerland. CASTING PROCESS WITH INSTANEOUS UNIDIRECTIONAL SOLIDIFICATION. Patent dated Nov. 8, 1977. Dedication filed Mar. 26, 1984, by the assignee, *Battelle Memorial Institute.*

Hereby dedicates to the People of the United States the entire remaining term of said patent.

[*Official Gazette May 22, 1984.*]